(12) United States Patent
Yan et al.

(10) Patent No.: US 7,075,103 B2
(45) Date of Patent: Jul. 11, 2006

(54) MULTILAYER DEVICE AND METHOD OF MAKING

(75) Inventors: Min Yan, Schenectady, NY (US); Anil Raj Duggal, Niskayuna, NY (US); Marc Schaepkens, Ballston Lake, NY (US); Tae Won Kim, Guilderland, NY (US)

(73) Assignee: General Electric Company, Niskayuna, NY (US)

( * ) Notice: Subject to any disclaimer, the term of this patent is extended or adjusted under 35 U.S.C. 154(b) by 110 days.

(21) Appl. No.: 10/739,298

(22) Filed: Dec. 19, 2003

(65) Prior Publication Data

US 2005/0133781 A1   Jun. 23, 2005

(51) Int. Cl.
*H01L 35/24* (2006.01)

(52) U.S. Cl. .......................................... 257/40; 438/40
(58) Field of Classification Search ................. 257/40; 438/99
See application file for complete search history.

(56) References Cited

U.S. PATENT DOCUMENTS

| | | |
|---|---|---|
| 3,223,549 A | 12/1965 | Fredley et al. |
| 3,240,686 A | 3/1966 | Towner |
| 3,515,909 A | 6/1970 | Trump |
| 4,230,658 A | 10/1980 | Matsukura et al. |
| 5,362,667 A | 11/1994 | Linn et al. |
| 5,387,555 A | 2/1995 | Linn et al. |
| 5,507,870 A | 4/1996 | Siebert |
| 5,517,047 A | 5/1996 | Linn et al. |
| 5,627,407 A | 5/1997 | Suhir et al. |
| 5,849,627 A | 12/1998 | Linn et al. |
| 5,998,803 A | 12/1999 | Forrest et al. |
| 6,180,241 B1 | 1/2001 | Suhir |
| 6,184,561 B1 | 2/2001 | Tanaka et al. |
| 6,250,758 B1 | 6/2001 | Yoshihara et al. |
| 6,316,332 B1 | 11/2001 | Lo et al. |
| 6,352,803 B1 | 3/2002 | Tong et al. |
| 6,465,953 B1 * | 10/2002 | Duggal ........................ 313/553 |
| 2002/0048900 A1 | 4/2002 | Lo et al. |
| 2004/0229051 A1 * | 11/2004 | Schaepkens et al. ......... 428/447 |

FOREIGN PATENT DOCUMENTS

| | | |
|---|---|---|
| EP | 0544098 B1 | 6/1993 |
| EP | 0545699 B1 | 6/1993 |
| EP | 0657298 A2 | 6/1995 |
| GB | 1335065 | 10/1973 |

(Continued)

OTHER PUBLICATIONS

U.S. Appl. No. 10/065,018, filed Sep. 11, 2002, Schaepkens et al.

(Continued)

*Primary Examiner*—Bradley K. Smith
(74) *Attorney, Agent, or Firm*—Mary Louise Gioeni; William E. Powell, III

(57) ABSTRACT

The invention relates to composite articles comprising a substrate and additional layers on the substrate. According to one example, the layers are selected so that the difference in the coefficient of thermal expansion (CTE) between the substrate and a first layer on one side of the substrate is substantially equal to the CTE difference between the substrate and a second layer on the other side of the substrate. The stress caused by the CTE difference and/or shrinkage on one side of the substrate during heating or cooling is balanced by the stress caused by the CTE difference on the other side of the substrate during heating or cooling. Such stress balancing can reduce or minimize curling of the substrate.

13 Claims, 8 Drawing Sheets

FOREIGN PATENT DOCUMENTS

| | | |
|---|---|---|
| GB | 2260650 A | 4/1993 |
| WO | 09423444 A2 | 10/1994 |
| WO | 0075727 A2 | 12/2000 |

OTHER PUBLICATIONS

Yoshihiro Okada, Atsushi Ban, Masaya Okamoto, Wataru Oka, Yutaka Matsuda, Sumio Shibahara, "A 4-Inch Reflective Color TFT-LCD Using A Plast Substrate," SID 02 Digest, p. 1204-1207 (2002).

Hiroyuki Suzuki, Satoshi Hoshino, Chien-Hua Yuan, Michiya Fujiki, Seiji Toyoda, Nobuo Matsumoto, "Near-Ultraviolet Electroluminescence From Polysilanes," 331 Thin Solid Films, p. 64-70 (1998).

* cited by examiner

MULTILAYER DEVICE AND METHOD OF MAKING

FIELD OF THE INVENTION

The present invention relates generally to multilayer devices, and more particularly to a multilayer electronic device comprising a polymeric substrate and a method of making the device.

BACKGROUND OF THE INVENTION

Various processes are known for fabricating electronic devices such as opto-electrical devices, photovoltaic devices, and liquid crystal display (LCD) devices. Commonly, these devices have been fabricated with a glass substrate and a conductor applied to the substrate which serves as an electrode. The conductor is first coated onto a side of the glass substrate, and then one or more additional layers are provided to complete the device. For example, in the case of an organic light emitting device (OLED), a transparent conductor such as indium tin oxide (ITO) may be coated onto a glass substrate to form an anode. Next, an electroluminescent layer comprising, for example, a blend of a hole transport polymer, an electron transport polymer and a light emissive polymer may be formed on the anode. Finally, a cathode is formed on the electroluminescent layer. The process of applying one or more of the layers may comprise steps that are carried out at an elevated temperature to achieve improved device properties.

One advantage of glass substrates is their low permeability to oxygen and water vapor, which reduces corrosion and other degradation of the OLED device. However, glass substrates are not suitable for certain applications in which flexibility is desired. In addition, manufacturing processes involving large glass substrates are typically slow and can therefore result in high manufacturing costs.

Recently, plastic substrates have been used in the fabrication of electronic devices. Plastic substrates have advantages over glass substrates because of their flexibility, light weight, thinness, and robustness. However, there can be certain technical challenges in fabricating electronic devices on plastic substrates. For example, the fabrication temperature typically must remain below the glass transition temperature, Tg, of the plastic substrate so that the substrate maintains its desirable physical properties, such as flexibility and transparency. In addition, plastic substrates typically have a relatively high coefficient of thermal expansion (CTE) compared to inorganic layers which may be applied in the fabrication process. A material's CTE indicates its expansion and contraction properties as a function of temperature. Furthermore, plastic substrates shrink after heating at elevated temperatures. Unlike thermal expansion, shrinkage is generally irreversible. Thermal expansion combined with shrinkage can therefore cause the article to curl significantly during heating and cooling processes, which may pose significant challenges during manufacturing.

Known electronic devices with plastic substrates typically have another disadvantage relating to oxygen and moisture diffusion. For example, plastic substrates are generally not impervious to oxygen and water vapor, and thus may not be suitable for the manufacture of certain devices such as OLEDs which may benefit from such properties. In order to improve the resistance of these substrates to oxygen and water vapor, coatings comprising ceramic materials have been applied to a surface of the plastic substrate. However, the interface between polymeric and ceramic layers is typically weak due to the incompatibility of the materials, and the layers are prone to be delaminated.

Accordingly, there is a need to provide flexible electronic devices that are robust against degradation due to environmental elements. There is also a need for reducing or preventing the stress and curl which may result from manufacturing processes employing thin film materials with varying CTEs.

SUMMARY OF THE INVENTION

According to one embodiment, the invention relates to an article comprising a polymeric substrate having a first side and a second side, a first layer on the first side of the polymeric substrate, the first layer having a first coefficient of thermal expansion (CTE), a second layer on the second side of the polymeric substrate, a third layer on the second layer, the third layer comprising a transparent conductor, and a fourth layer on the third layer, the fourth layer comprising an organic semiconductor layer, wherein the second layer has a second CTE which is substantially equal to the first CTE.

The invention also relates to a method of making a multilayer article comprising the steps of applying a first layer on a first side of a polymeric substrate, the first layer having a first coefficient of thermal expansion (CTE), applying a second layer on a second side of the polymeric substrate, heating the polymeric substrate, applying a third layer comprising a transparent conductor on the second layer, cooling the article, and applying a fourth layer on the third layer, the fourth layer comprising an organic semiconductor layer, wherein the second layer has a second CTE which is substantially equal to the first CTE.

According to yet another embodiment, the invention relates to an article and a method for making the article, wherein article comprises a composite substrate comprising a first plastic substrate, a second plastic substrate, and a layer between the first plastic substrate and the second plastic substrate, wherein the composite substrate has a first coefficient of thermal expansion (CTE), and a transparent conductor on the composite substrate, the transparent conductor having a second CTE, wherein the first CTE is substantially equal to the second CTE.

According to still another embodiment, the invention relates to an article and a method for making the article, wherein the article comprises a polymeric substrate, a first layer on one side of the polymeric substrate, the first layer having a first coefficient of thermal expansion (CTE), and a second layer on the other side of the polymeric substrate, the second layer having a second CTE, wherein the second layer comprises a transparent conductor, and the first CTE is substantially equal to the second CTE.

DETAILED DESCRIPTION OF THE INVENTION

Figure 1:
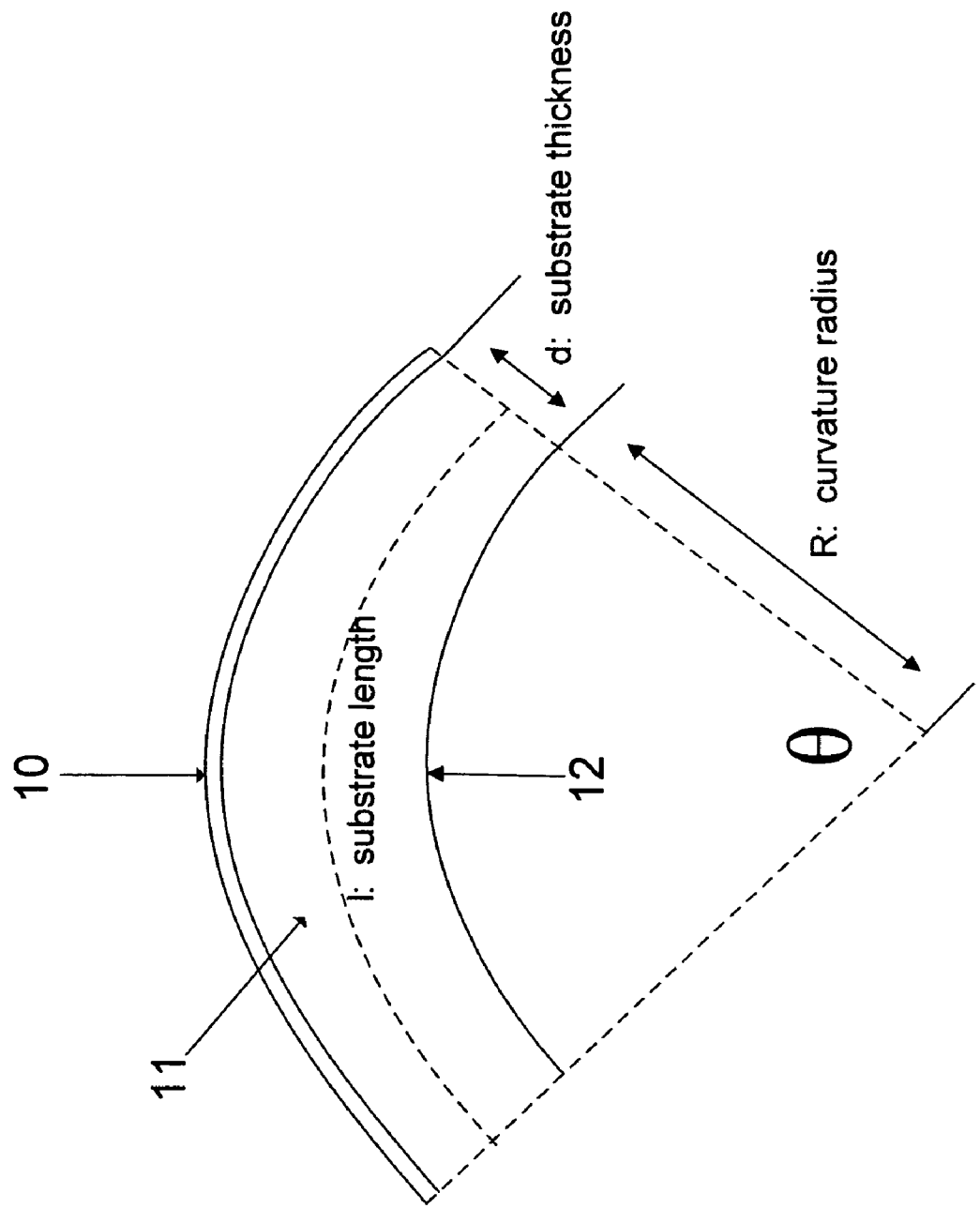
FIG. 1 is a diagram showing the curvature of a coated substrate.

FIG. 1 is a diagram illustrating the curvature of a substrate 11 coated with a layer 10. The curling of the substrate 11 can result, for example, from heating a plastic substrate such as polycarbonate (PC) having a relatively high coefficient of thermal expansion (CTE), applying a transparent conductor such as indium tin oxide (ITO) having a lower CTE to the substrate, and then cooling the composite article. As shown in FIG. 1, R is the radius of curvature measured from the center of curvature to the inner edge 12 of the substrate 11, d is the substrate thickness, l is the length of the substrate 11, and θ is the angle defining the endpoints of the length l of the substrate 11. When two flat materials curl, the relationship between the length l of the substrate, the shrinkage percent (Δl/l), and the radius of curvature R can be described by the following equations:

$$\Delta l = \theta \cdot (R+d) - \theta \cdot R = \theta \cdot d$$

$$\text{Shrinkage percent} = \Delta l/l = \theta \cdot d/[\theta \cdot (R+d)]$$

$$R = d \cdot (\Delta l)$$

In general, as the radius R increases, the curl decreases. As the shrinkage percent of the substrate decreases, the radius R increases and the curl decreases. A low shrinkage percent will result in a large radius R and small curl. A high shrinkage percent will result in a small radius R and large curl. The thinner the substrate 11, the more pronounced the curl. Reducing the CTE difference between the layer 10 and the substrate 11 results in an increased radius and reduced curl.

Figure 5:
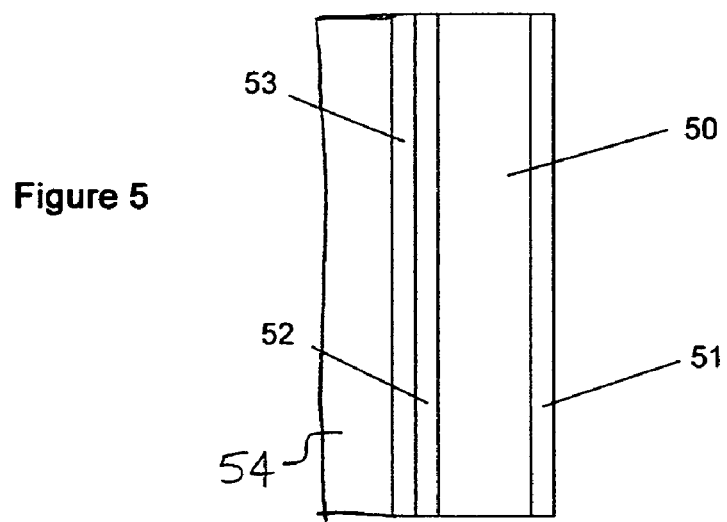
FIG. 5 illustrates one embodiment of the present invention.
Figure 6:
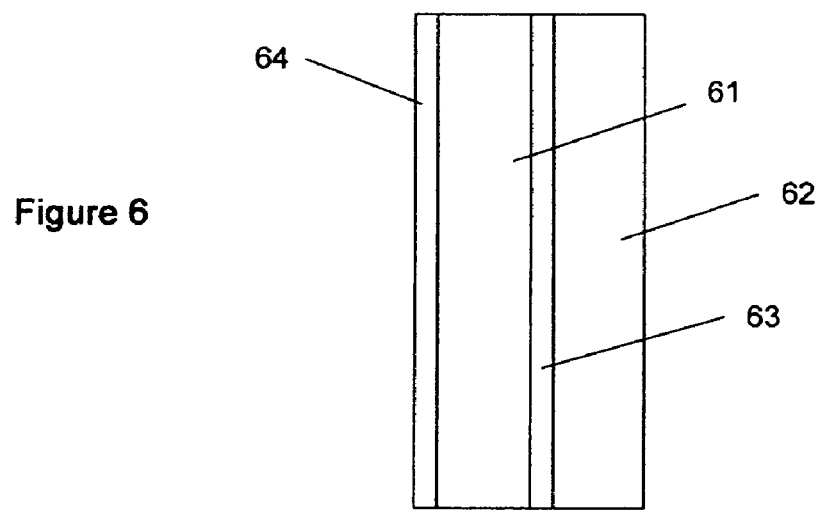
FIG. 6 illustrates another embodiment of the present invention.
Figure 7:
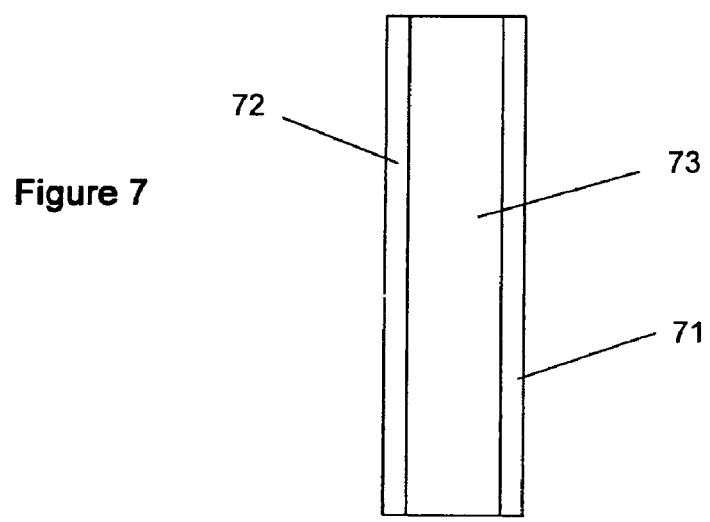
FIG. 7 illustrates another embodiment of the present invention.
Figure 8:
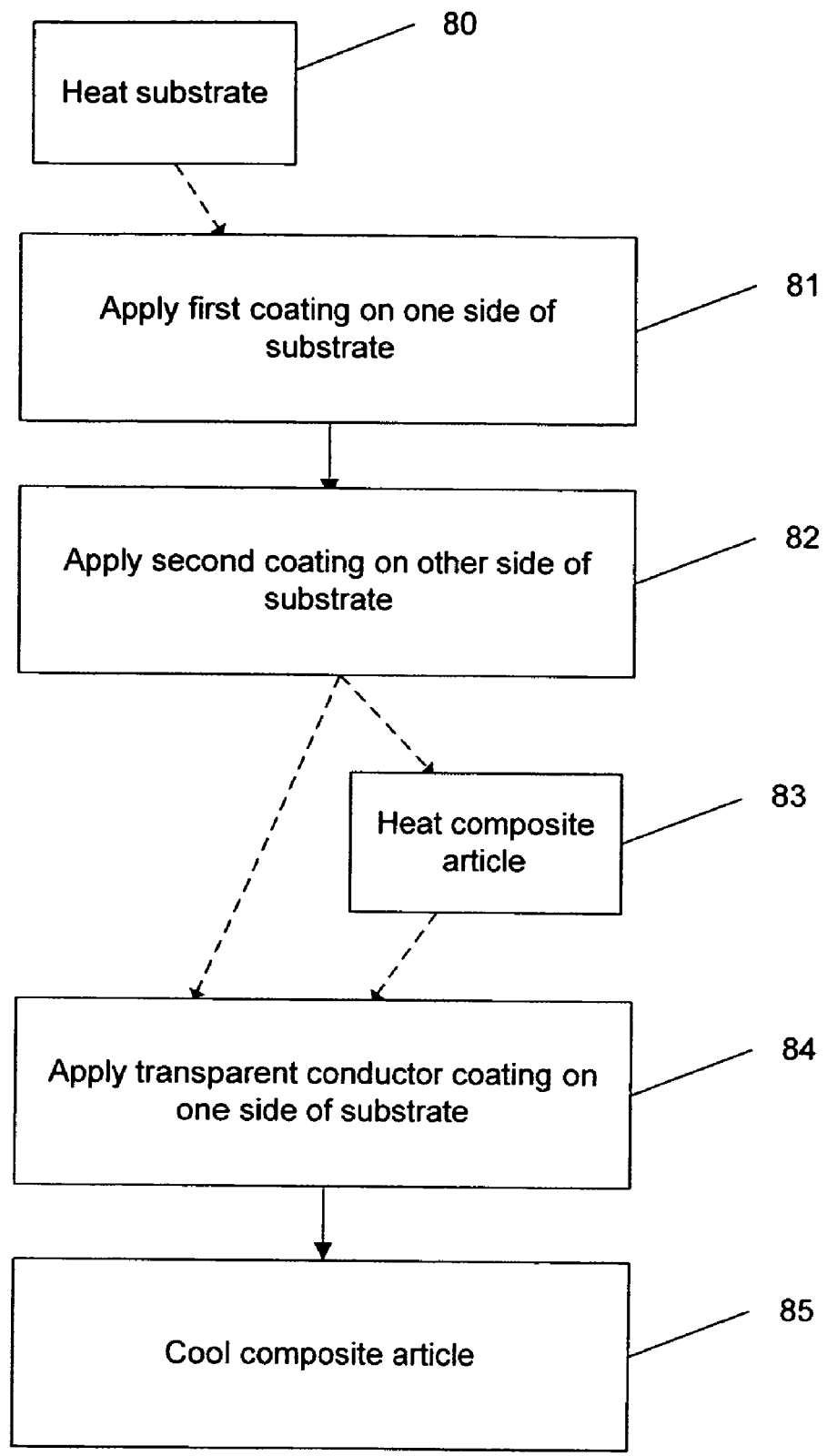
FIG. 8 is a flow chart showing a method of producing the article of FIG. 5 according to an exemplary embodiment of the invention.
Figure 9:
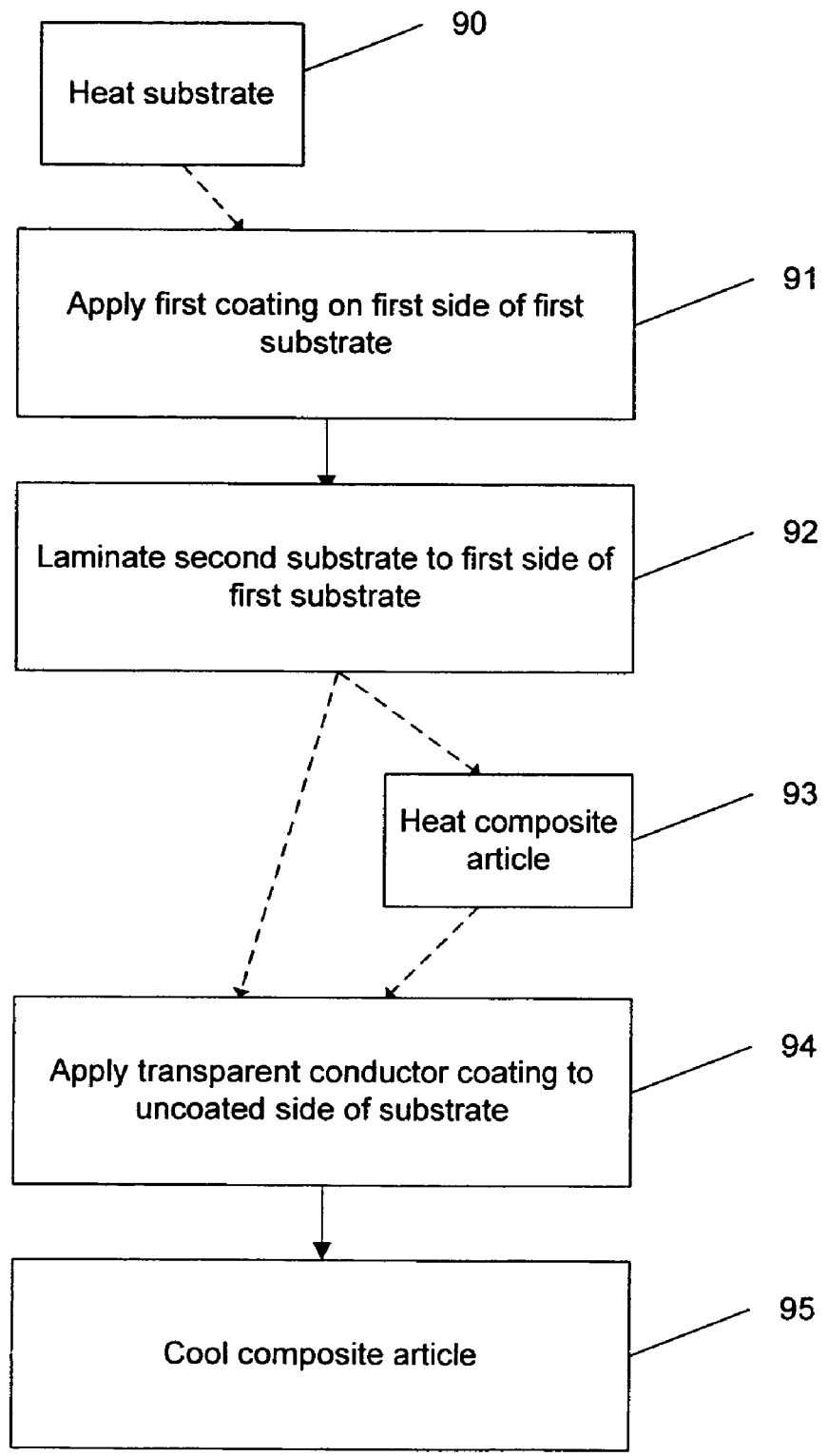
FIG. 9 is a flow chart showing a method of producing the article of FIG. 6 according to an exemplary embodiment of the invention.
Figure 10:
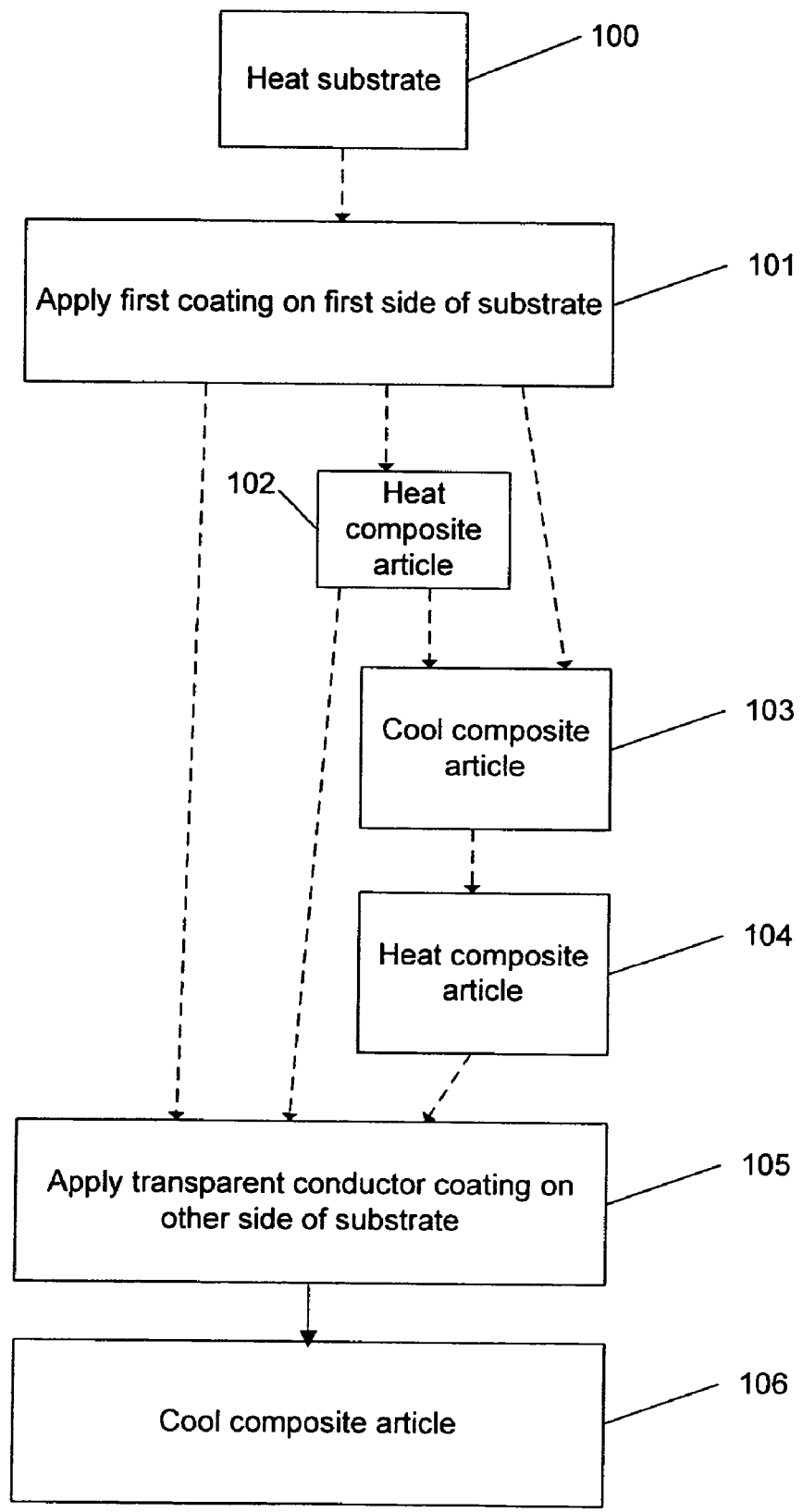
FIG. 10 is a flow chart showing a method of producing the article of FIG. 7 according to an exemplary embodiment of the invention.

FIGS. 5–7 illustrate embodiments of the invention which can be made according to the methods described in FIGS. 8–10, respectively.

FIG. 5 shows an article comprising a substrate 50, a first layer 51, a second layer 52, a third layer 53, and a fourth layer 54. The substrate 50 may comprise a plastic material such as polycarbonate or another polymer such as polyethyleneterephthalate, polyacrylate, silicone, epoxy resin, silicone-functionalized epoxy resin, polyester, polyimide, polyetherimide, polyethersulfone, polyethylenenapthalene, polynorbonene, or poly(cyclic olefin), for example. One particular example of a suitable material for the substrate 50 is a polycarbonate with a 1,3-bis(4-hydroxyphenyl)menthane repeat unit (1,3-BHPM PC, or BHPM). The substrate 50 is typically thin and flat and may be transparent or opaque. According to one embodiment, the substrate 50 has a thickness of about 76 microns (3 mils).

The first and second layers 51, 52 may comprise, for example, a transparent low-CTE material, such as a metal nitride, metal oxide, metal oxy-nitride, or any combination thereof. Examples include aluminum oxide, aluminum nitride, aluminum oxy-nitride, silicon oxide, silicon nitride, silicon oxy-nitride, cadmium oxide, indium oxide, tin oxide, and mixtures thereof. If desired, these materials can be doped with aluminum, nitrogen, fluorine, carbon, boron, phosphor, indium, and/or hydrogen, for example. According to exemplary embodiments of the invention, one or both of the first and second layers 51, 52 comprise(s) silicon nitride (SiNx), silicon oxy-nitride (SiNxOy), or an amorphous hydrogenated silicon nitride (a-SiNx:H), where x may range from 0 to 2 and y may range from 0 to 2, for example. According to another embodiment the first and second layers 51, 52 comprise tin-doped indium oxide (ITO). The CTE value of these materials may range from 1 to 20 ppm/K, more typically ranges from 1 to 10 ppm/K, and most typically ranges from 5 to 10 ppm/K.

The first and second layers 51, 52 described above can function as gas/moisture barrier layers, for example, to prevent or diminish oxygen and water from passing into or through the coated substrate 50. A gas/moisture barrier layer may have a transmission rate of oxygen through the coated substrate of less than approximately 0.1 cm$^3$/(m$^2$ day), as measured at 25 degrees C. and with a gas containing 21 volume-percent oxygen, and a transmission rate of water vapor through the coated substrate of less than approximately 1 g/(m$^2$ day), as measured at 25 degrees C. and with a gas having 100-percent relative humidity, for example.

In one embodiment the first and second layers 51, 52 comprise the same material, such as SiNx. In another embodiment, the layers 51, 52 comprise additional layers of coatings and substrates, such as an additional substrate-coating-substrate structure.

FIG. 5 also shows a third layer 53 which may comprise a transparent conductor (TC), for example. As shown in FIG. 5, the third layer 53 can be applied to the second layer 52. Examples of suitable materials for the third layer 53 include transparent conductors such as thin metals and transparent conducting oxides, for example. A particular example is indium tin oxide (ITO). The third layer 53 may function as an electrode.

The article of FIG. 5 also shows a fourth layer 54. The fourth layer 54 may comprise an electroluminescent layer, for example. Examples of a suitable material for an electroluminescent layer include a polymer, a copolymer, a mixture of polymers, or lower molecular-weight organic molecules having unsaturated bonds. Such materials possess a delocalized π-electron system, which gives the polymer chains or organic molecules the ability to support positive and negative charge carriers with high mobility. Suitable electroluminescent polymers are poly(N-vinylcarbazole) ("PVK", emitting violet-to-blue light in the wavelengths of about 380–500 nm); poly(alkylfluorene) such as poly(9,9-dihexylfluorene) (410–550 nm), poly(dioctylfluorene) (wavelength at peak electroluminescent emission of 436 nm), or poly{9,9-bis(3,6-dioxaheptyl)-fluorene-2,7-diyl} (400–550 nm); poly(praraphenylene) derivatives such as poly(2-decyloxy-1,4-phenylene) (400–550 nm). Mixtures of these polymers or copolymers based on one or more of these polymers and others may be used to tune the color of emitted light.

Another class of suitable electroluminescent polymers is the polysilanes. Polysilanes are linear silicon-backbone polymers substituted with a variety of alkyl and/or aryl side groups. They are quasi one-dimensional materials with delocalized σ-conjugated electrons along polymer backbone chains. Examples of polysilanes are poly(di-n-butylsilane), poly(di-n-pentylsilane), poly(di-n-hexylsilane), poly(methylphenylsilane), and poly{bis(p-butylphenyl)silane} which are disclosed in H. Suzuki et al., "Near-Ultraviolet Electroluminescence From Polysilanes," 331 Thin Solid Films 64–70 (1998). These polysilanes emit light having wavelengths in the range from about 320 nm to about 420 nm.

Organic materials having molecular weight less than about 5000 that are made of a large number of aromatic units are also applicable. An example of such materials is 1,3,5-tris{n-(4-diphenylaminophenyl)phenylamino}benzene, which emits light in the wavelength range of 380–500 nm. The electroluminescent layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415–457 nm, aluminum-(picolymethylketone)-bis{2,6-di(t-butyl)phenoxide} or scandium-(4-methoxy-picolylmethylketone)-bis(acetylacetonate), which emits in the range of 420–433 nm.

The article of FIG. 5 can form part of an electronic device. For example, a second electrode can be applied to the fourth layer 54 to form an OLED device. In this case, when a voltage is supplied by a voltage source and applied across the first and second electrodes, the electroluminescent layer emits light. The articles of FIGS. 6 and 7 can also similarly form part of an electronic device, as will be appreciated by those skilled in the art.

A method of making the article shown in FIG. 5 will now be described with reference to FIG. 8. First, in optional step 80, the substrate 50 is heated. Preferably, the substrate 50 is heated to a temperature below the glass transition temperature, Tg, of the substrate 50. The substrate 50 may be heated to 200 degrees Celsius or more, for example.

In steps 81 and 82, the first layer 51 and the second layer 52 are applied to the substrate 50. These steps 81, 82 may occur in reverse order, or they may occur simultaneously. The steps 81, 82 may begin the process, or they may occur after the substrate 50 is heated in optional step 80. The first and second layers 51, 52 may be in a heated or unheated state when they are applied to the substrate 50.

The first and second layers 51, 52 may be applied to the substrate 50 using a variety of known methods. For instance, some compositions such as SiNx may be deposited on the substrate by plasma-enhanced chemical vapor deposition (PECVD). Other compositions, such as ITO, may be sputter-deposited on the substrate. Generally, the coating materials, including transparent conductors, may be applied to the substrate by a method such as plasma-enhanced chemical-vapor deposition, radio-frequency plasma-enhanced chemical-vapor deposition, expanding thermal-plasma chemical-vapor deposition, sputtering, reactive sputtering, electron-cyclotron-resonance plasma-enhanced chemical-vapor deposition, inductively-coupled plasma-enhanced chemical-vapor deposition, expanding thermal-plasma chemical-vapor deposition, radio-frequency plasma-enhanced chemical-vapor deposition, or combinations thereof.

If the substrate 50 is not heated in step 80, then the composite article can be heated in step 83. If the substrate 50 is heated in step 80, then the composite article need not be heated in step 83. Preferably, the article is heated to a temperature below the glass transition temperature, Tg, of the substrate 50.

Because of the CTE difference between the substrate 50 and the first and second layers 51, 52, heating the composite article may create stress forces between the substrate 50 and the first layer 51 on one side of the substrate 50, and also between the substrate 50 and the second layer 52 on the other side of the substrate 50.

According to exemplary embodiments of the invention, the first and second layers 51, 52 are selected so that the first layer 51 on one side of the substrate 50 stress balances the second layer 52 on the other side of the substrate 50 during a cooling and/or heating process. For example, the difference in CTE between the substrate 50 and the first layer 51 can be chosen to be substantially equal to the CTE difference between the substrate 50 and second layer 52. The CTE-induced stress forces on one side of the substrate 50 substantially balance the corresponding stress forces on the other side during the heating process. Such stress balancing can reduce or minimize curling of the substrate during heating.

While the composite article is in a heated state (either from step 80 or 83), a third layer 53, which may comprise a transparent conductor, is applied to the second layer 52 in step 84. The third layer 53 may comprise a thin metal and/or transparent conducting oxide, for example. According to one embodiment, the third layer 53 comprises ITO. The ITO may contain approximately nine times more indium than tin, by mass, for example. According to one embodiment, the third layer 53 functions as an electrode, and the heating step is useful for applying the third layer 53 onto the second layer 52 and/or improving the electro-optical properties of the third layer 53.

In step 85, the composite article is cooled. In a preferred embodiment, the stress forces resulting from the CTE differential between the substrate 50 and the first layer 51 on one side of the substrate substantially balance the corresponding stress forces resulting from the CTE differential between the substrate 50 and the second layer 52, on the other side of the substrate during the cooling process. The resulting curl of the composite article is consequently reduced or minimized.

After the first, second and third layers 51, 52, and 53 are applied to the substrate 50, any desired additional layers, such as electroluminescent layers and a second electrode for an OLED, can be applied to complete the electronic device.

According to another embodiment, the three layers 51, 52, 53 are selected so that the first layer 51 on one side of the substrate 50 stress balances the combination of the second and third layers 52, 53 on the other side of the substrate 50 during a cooling and/or heating process. However, the CTE-induced stress resulting from the third layer 53, which may comprise a transparent conductor for example, is typically small or negligible compared to that of the first and second layers 51, 52. In such case, only the first and second layers 51, 52 may need to be selected to balance the CTE-induced stress from heating and/or cooling since the CTE-induced stress from the third layer 53 is relatively small.

FIG. 6 illustrates an article according to another embodiment of the invention. The article of FIG. 6 can be fabricated using the method illustrated in FIG. 9. The article comprises a first substrate 61, a second substrate 62, a first layer 63 between the substrates, and a transparent conductor layer 64 on the first substrate 61.

The first and second substrates 61, 62 may comprise a plastic material such as polycarbonate or another polymer such as polyethyleneterephthalate, polyacrylate, silicone, epoxy resin, silicone-functionalized epoxy resin, polyester, polyimide, polyetherimide, polyethersulfone, polyethylenenapthalene, polynorbonene, or poly(cyclic olefin), for example. One particular example of a suitable material for the substrates 61, 62 is a polycarbonate with a 1,3-bis(4-hydroxyphenyl)menthane repeat unit (1,3-BHPM PC, or BHPM). The substrates 61, 62 are typically thin and flat. According to one embodiment, each of the substrates 61, 62 has a thickness of approximately 25–250 microns. Typically, the first substrate 61 is transparent. The second substrate 62 may be transparent or opaque.

The first layer 63 between the two substrates 61, 62 may comprise a transparent low-CTE material, such as a metal nitride, metal oxide, metal oxy-nitride, or any combination thereof, for example. According to one embodiment of the invention, the first layer 63 comprises SiNx. According to another embodiment, the first layer 63 comprises ITO. As described above with respect to the first and second layers 51 and 52 in FIG. 5, the first layer 63 may function as a gas/moisture barrier layer to prevent or diminish oxygen and water from passing into or through the coated substrate.

The transparent conductor layer 64 may comprise a thin metal and/or transparent conducting oxide, for example. According to one embodiment, the transparent conductor layer 64 comprises ITO. The ITO may contain approximately nine times more indium than tin, by mass, for example. The transparent conductor layer 64 may function as an electrode, for example.

The first substrate 61, the second substrate 62, and the first layer 63 together form a what may be referred to as a composite substrate. The composite substrate may have a CTE which is a function of the CTEs of its individual layers. The article may be designed such that the CTE of the composite substrate is substantially equal to the CTE of the transparent conductor layer 64.

The article in FIG. 6 can be formed using the method illustrated in FIG. 9. Referring to FIG. 9, in optional step 90, the first substrate 61 is heated, as described above in connection with FIGS. 5 and 8. If the first substrate 61 is not heated in this step, the first substrate 61 may be heated later in step 93.

In step 91, the first layer 63 is applied to a first side of the first substrate 61. The first layer 63 may be applied by any of the methods described above with reference to FIGS. 5 and 8. This step may begin the process of FIG. 9, or it may occur after the first substrate 61 is heated.

Figure 2:
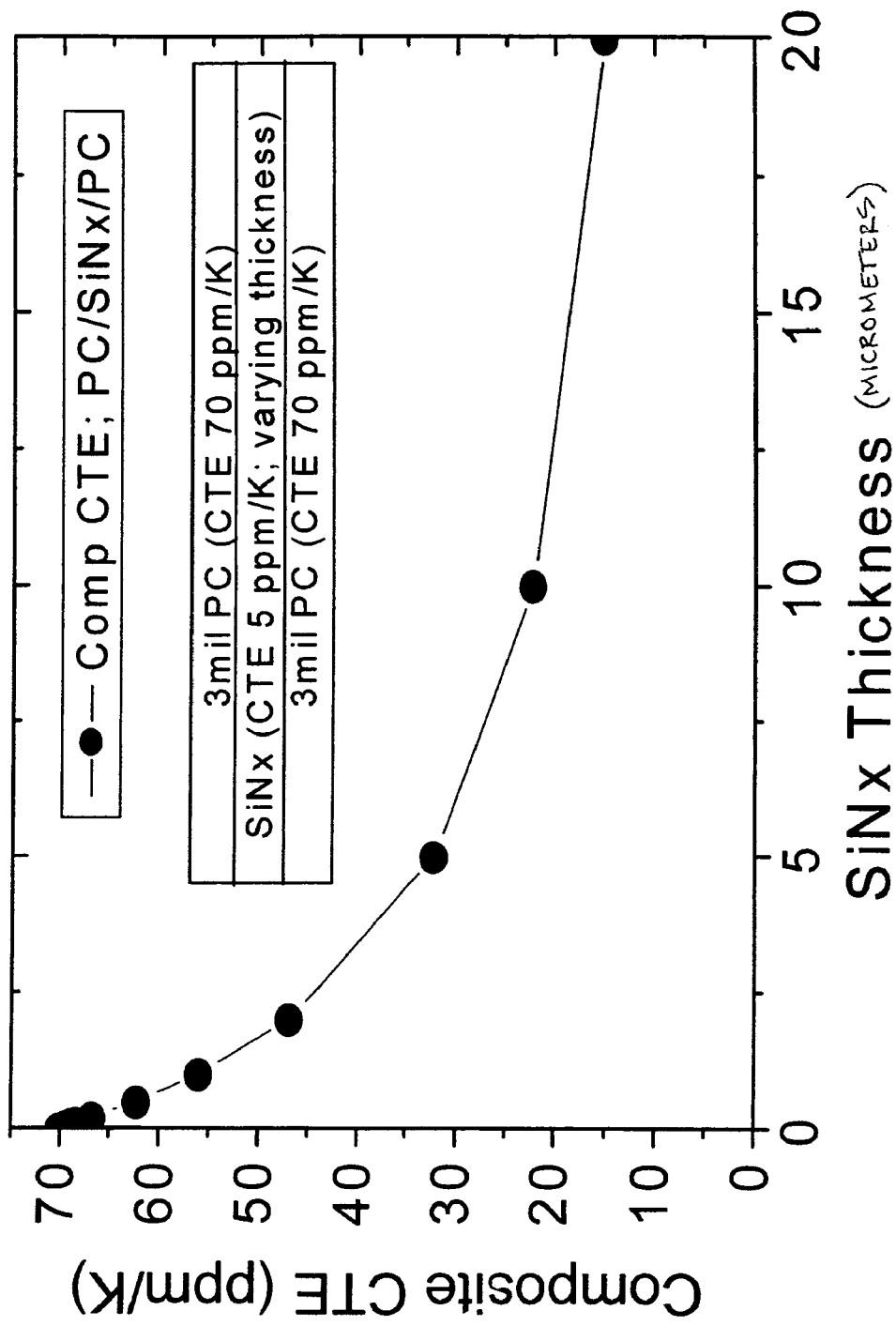
FIG. 2 is a graph of the CTE of a composite substrate as a function of layer thickness, illustrating one aspect of the present invention.

In step 92, a second substrate 62 is laminated or otherwise affixed to the first layer 63. The first and second substrates 61, 62 may be in a heated or unheated state during step 92. Typically, the first layer 63 and the first and second substrates 61, 62 are selected so that the composite substrate (61, 62, 63) has a relatively low CTE. As will be described further below, the graph in FIG. 2 illustrates how such a composite substrate may be designed to have a relatively low CTE, e.g., by increasing the thickness of the first layer 63.

In optional step 93, if the first substrate 61 was not heated in step 90, the composite article is heated. If the composite article has a low CTE, it exhibits relatively little curling during the heating step because it does not expand or contract significantly.

The components 61, 62, 63 of the composite substrate can also be selected such that that the CTE-induced stress between the first layer 63 and the first substrate 61 balances the stress between the first layer 63 and the second substrate 62 in a heating and/or cooling process.

The composite substrate can be designed with one or both of these features, e.g., the composite substrate itself can have a relatively low CTE and/or the CTE-induced stress on each side of the first layer 63 is balanced.

During the heat treatment, the transparent conductor layer 64 is applied to the uncoated side of the first substrate 61 in step 94. This heating step may improve the properties of the transparent conductor layer 64. For example, the heating step may effect a reduction in sheet resistance, increased bulk conductivity, and/or increased light transmission in the wavelength range of 400 to 700 nanometers of the transparent conductor layer 64.

Finally, in step 95, the resulting article is cooled. During the cooling step, curling of the resulting article can be reduced or minimized. The curling can be reduced because the two materials affixed to each other, namely the transparent conductor layer 64 and the composite substrate of step 92, both have low CTEs. In addition, the curling can be reduced due to stress balancing on opposite sides of the first layer 63. In addition, the curling can be reduced because of stress balancing between the composite substrate and the transparent conductor layer 64. In many cases, the effect of a CTE-induced stress of the second layer 64 is insignificant compared to the stress forces of the other components. Thus, as long as the composite substrate 61, 62, 63 is designed to minimize or reduce curling, then the article including the second layer 64 also will minimize or reduce curling, because the effect of the second layer 64 is relatively small.

FIG. 7 illustrates an article according to another embodiment of the invention comprising a first layer 71, a second layer 72, and a substrate 73. FIG. 10 illustrates a method of making the article shown in FIG. 7. The first and second layers 71, 72 and the substrate 73 may be formed of the materials and by the methods described above in connection with FIGS. 5–6 and 8–9. According to one embodiment, the first layer 71 comprises SiNxOy or SiNx, the second layer 72 comprises a transparent conductor such as ITO, and the substrate 73 comprises polycarbonate.

Referring to FIG. 10, in optional step 100, the substrate 73 is heated, as described above in connection with FIG. 8. If the substrate 73 is not heated in this step, the substrate 73 may be heated later in step 102.

In step 101, the first layer 71 is applied on one side of the substrate 73. This step may occur after heating in optional step 100, or it may be the first step in the process of FIG. 10. In optional step 102, the composite article is heated if the substrate 73 was not heated in step 100. There may be a CTE differential between the substrate 73 and first layer 71 which results in some curling during this heating step 102.

Steps 103 and 104 provide for an optional cooling and then re-heating process. Thus, the method of FIG. 10 can pass from step 102 straight to step 105, or it can pass from step 102 through both steps 103 and 104 to step 105. In step 103, the composite article is cooled. As a result of this cooling, the CTE differential may cause significant curling. At this point, the composite article may be collected and stored before it undergoes further fabrication. If desired, the article can be flattened prior to storage and prior to step 104. In step 104, the composite article is heated again.

In step 105, the second layer 72, preferably a transparent conductor, is applied to the other side of the substrate 73 using one of the methods described above. The article now has two low-CTE layers 71, 72 on either side, which can balance stress forces that might otherwise result from cooling. In step 106, the article is cooled. The first and second layers 71, 72 can be selected so that the article is stress-balanced during cooling, thereby minimizing or eliminating curling.

It should be appreciated, however, that some small CTE differential might be desirable or advantageous in any of the above embodiments. In such a case, the layers and substrate(s) can be selected to achieve the desired CTE differential and/or curl. It should also be appreciated that any stress-balancing contemplated above will depend on the chemical properties and dimensions (e.g., thickness, length, width, and uniformity) of the layers and substrates.

EXAMPLE 1

Figure 3:
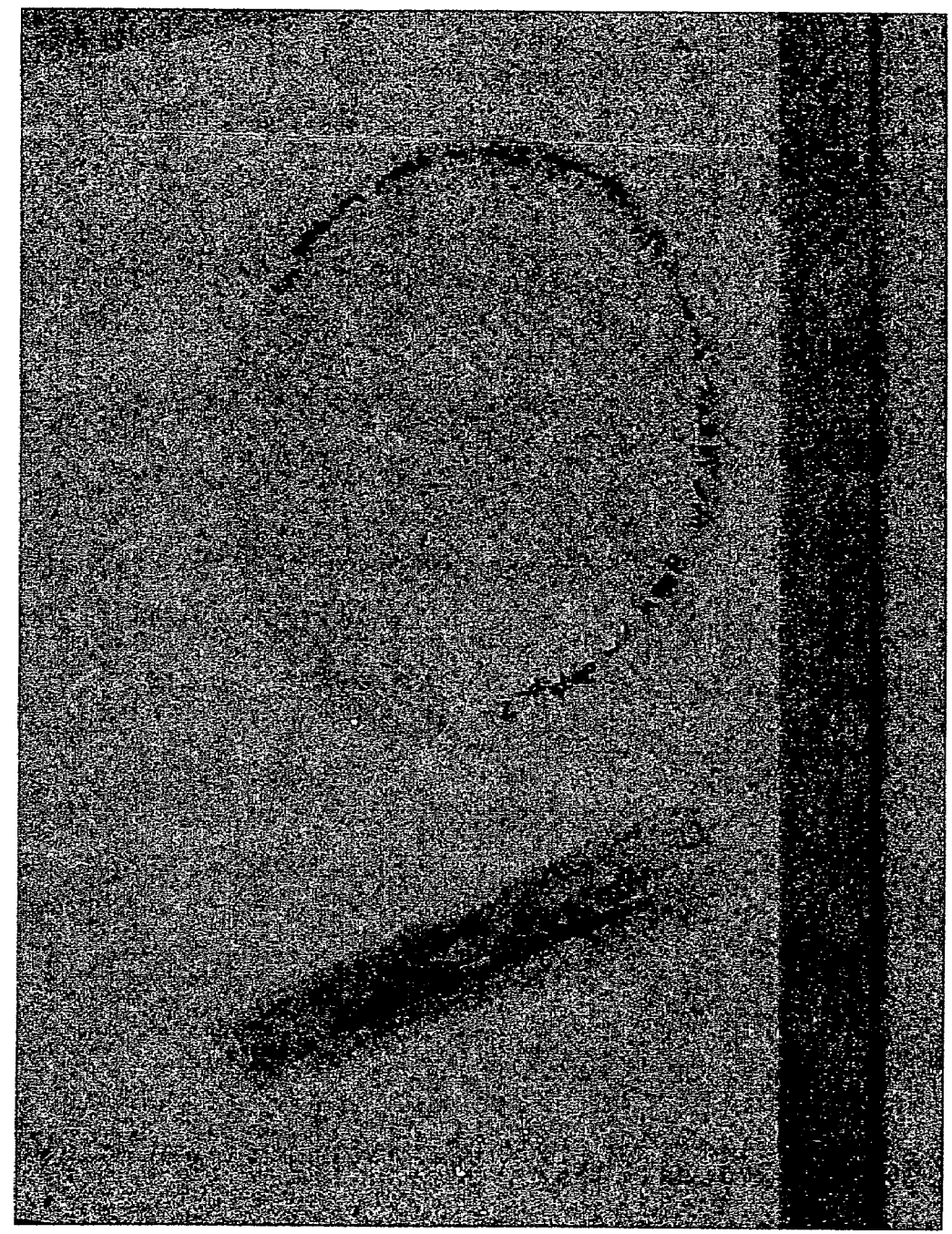
FIG. 3 is a photograph illustrating the curvature of a first article resulting from a high-temperature fabrication process on a plastic substrate where one side is coated with ITO as compared with a second article resulting from the same process where both sides are coated with ITO.

FIG. 3 is a photograph illustrating two composite articles resulting from a heat treatment of a plastic substrate coated with ITO on one side (article on the left) or both sides (article on the right). The plastic substrate comprised 1,3BHPM polycarbonate film having a thickness of 75 microns. The ITO had a thickness of 150 nanometers. The ITO was dc magnetron sputtered from a 10% $SnO_2$, 90% $In_2O_3$ sputtering target. The sputtering was conducted at room temperature and the heat treatment was conducted at 200° C. Before heat treatment, the articles had a flat, circular shape with a diameter of approximately 17.8 centimeters (7 inches) and a thickness of 75 microns. The photograph of FIG. 3 shows the two articles after heat treatment. The article on the left side of the photograph has one side coated with ITO. This article shows significant curvature after heat treatment, as the originally flat plastic material has curved to such an extent that it has rolled into a cylindrical shape having a radius of less than 2.54 cm (1 inch). This is because the shrinkage of the plastic material created a substantial residual stress causing the material to curl after heating. On the right side of the photograph is a plastic substrate having both sides coated with ITO. The article is substantially flat after heat treatment. This is because the stress resulting from the shrinkage of the plastic substrate is balanced by the stress resulting from the shrinkage on the other side of the substrate.

EXAMPLE 2

FIG. 2 is a graph showing the calculated CTE of a hypothetical composite article as a function of layer thickness according to an exemplary embodiment of the invention. In this embodiment, the hypothetical composite article comprises a silicon nitride (SiNx) layer sandwiched between two 76.2 micrometer (3 mil) layers of a polycarbonate substrate. The data in FIG. 2 are based on theoretical calculations using the material parameters from a-SiNx:H and 1,3-BHPM polycarbonate.

In general, the CTE of a composite article depends on the respective CTEs of its constituent parts as well as the relative proportions of those constituent parts. Polycarbonate has a relatively high CTE compared to silicon nitride. A composite article consisting of a combination of polycarbonate and silicon nitride will typically have a composite CTE between the two CTEs of its constituent parts with a value dependent on the relative proportions of those parts.

FIG. 2 shows that as the relative proportion of low-CTE SiNx increases in the composite article, the CTE of the composite article decreases to approach the CTE of the SiNx. When the thickness of the SiNx layer is zero, the CTE of the polycarbonate is approximately 70 ppm/K. When the thickness of the SiNx layer is 10 nanometers (nm), the composite CTE decreases to approximately 25 ppm/K. When the thickness of the SiNx layer is 20 nm, the composite CTE decreases further to approximately 15 ppm/K. Thus, increasing SiNx thickness can significantly reduce the CTE of the composite article. As described above in connection with FIG. 6, the CTE of the composite substrate can be matched to the CTE of another layer for the purpose of stress balancing.

EXAMPLE 3

Figure 4:
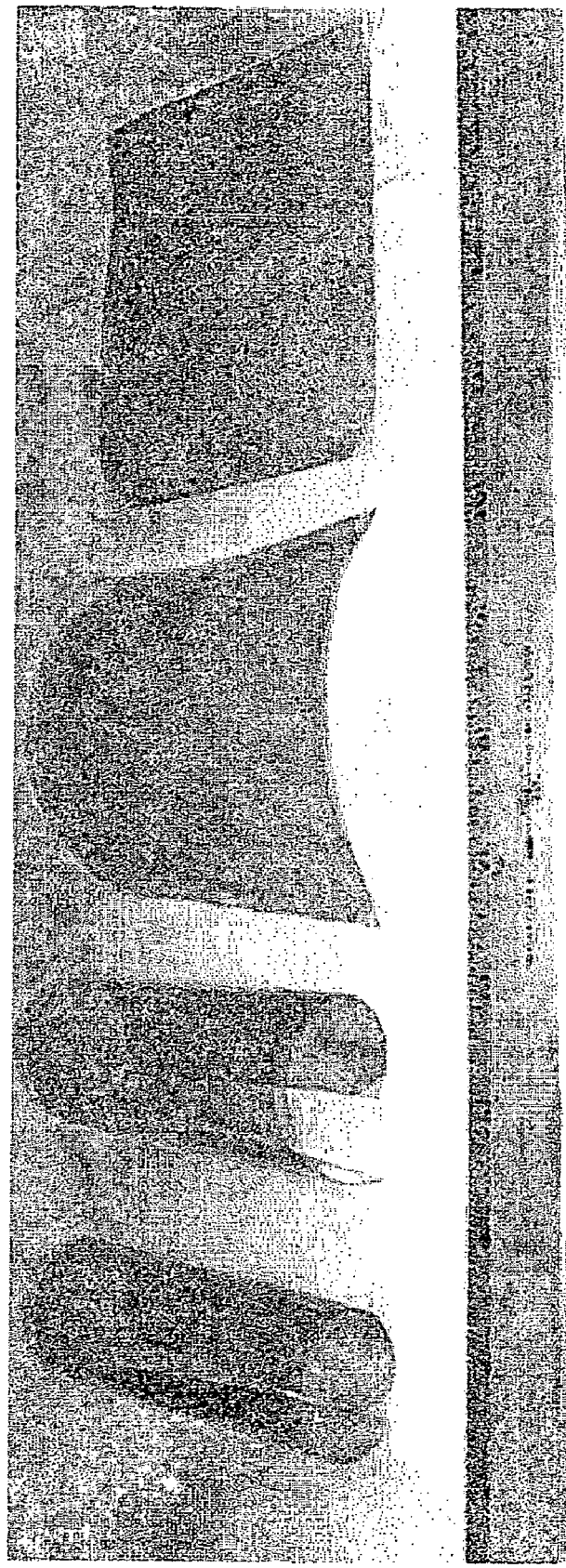
FIG. 4 is a photograph illustrating the different curvatures resulting from a fabrication process on a plastic substrate where one side of the substrate is coated with a fixed thickness of ITO and the other side is coated with varying thicknesses of SiNx.

FIG. 4 is a photograph illustrating articles with different curvatures resulting from a fabrication process on a plastic substrate where one side of the substrate is coated with a fixed thickness of ITO (150 nm) and the other side is coated with varying thicknesses of SiNx. The plastic substrate comprised 1,3-BHPM polycarbonate film having a thickness of 75 microns. The x in the SiNx ranged from 0.8 to 1.4. The SiNx was plasma deposited in a parallel-plate, capacitively-coupled plasma fed with silane, ammonia and helium. The ITO was dc magnetron sputtered from a 10% $SnO_2$, 90% $In_2O_3$ sputtering target. The SiNx was applied at a temperature of 75 degrees C. and the ITO was applied at a temperature of 75 degrees C. Before application of any of the coatings at elevated temperature, each article had the shape of a thin and flat square with a length of approximately 10.2 centimeters (4 inches). The far left article shows the control article, which had no SiNx layer (0 nm). In this article, the stress forces resulting from the CTE difference between the plastic substrate and the ITO layer caused a significant curl. Because the other side of the plastic substrate had no layer, there was no opposite stress from a CTE imbalance to prevent or diminish the curl. One edge of the article has substantially curled back onto its opposite edge so that the article as a whole has a cylindrical shape.

The article second from the left has a layer of 70 nm of SiNx on the side opposite to the 150 nm ITO layer. In this article there is curling, but the curl is less pronounced than the article with no SiNx layer. The article third from the left was coated with 100 nm of SiNx. While there is some curling, the article maintains a relatively flat shape, and the curl is much less pronounced than in either of the aforementioned articles. In the last article, on the right side of the photograph, the 150 nm ITO layer is balanced with a 150 nm SiNx layer on its opposite side. In this article, the stress resulting from the CTE difference between the plastic and ITO layer is balanced by the stress resulting from the CTE difference between the plastic and the SiNx layer. This example illustrates advantages which can be provided by an embodiment of the article shown in FIG. 7.

It will be understood that the specific embodiment of the invention shown and described herein is exemplary only. Numerous variations, changes, substitutions and equivalents will now occur to those skilled in the art without departing from the spirit and scope of the present invention. Accordingly, it is intended that all subject matter described herein and shown in the accompanying drawings be regarded as illustrative only and not in a limiting sense and that the scope of the invention be determined by the appended claims.

What is claimed is:

1. An article comprising:
    a polymeric substrate having a first side and a second side;
    a first layer on the first side of the polymeric substrate, the first layer having a first coefficient of thermal expansion (CTE);
    a second layer on the second side of the polymeric substrate;
    a third layer on the second layer, the third layer comprising a transparent conductor; and a fourth layer on the third layer, the fourth layer comprising an organic semiconductor layer;
wherein the second layer has a second CTE which is substantially equal to the first CTE.

2. The article of claim 1, wherein the fourth layer comprises an organic electroluminescent layer.

3. The article of claim 1, wherein the fourth layer comprises an organic photovoltaic layer.

4. The article of claim 1, wherein said transparent conductor comprises a metal or a conducting oxide.

5. The article of claim 1, wherein the transparent conductor comprises indium tin oxide.

6. The article of claim 1, wherein the polymeric substrate comprises polycarbonate.

7. The article of claim 1, wherein the polymeric substrate comprises at least one of: polyethyleneterephthalate, polyacrylate, silicone, epoxy resin, silicone-functionalized epoxy resin, polyester, polyimide, polyetherimide, polyethersulfone, polyethylenenapthalene, polynorbonene, and poly(cyclic olefin).

8. The article of claim 1, wherein the polymeric substrate comprises at least one of: polyethyleneterephthalate, polyethelenenapthalene, polynorbonene, and poly(cyclic olefins).

9. The article of claim 1 wherein the polymeric substrate comprises a polycarbonate with a 1,3-bis(4-hydroxyphenyl) menthane repeat unit, the first and second layers comprise SiNx, and the third layer comprises indium tin oxide.

10. The article of claim 1, wherein the first and second layers each comprise at least one of: a metal nitride, a metal oxide, and a metal oxy-nitride.

11. The article of claim 1, wherein the first and second layers comprise the same material.

12. The article of claim 1, wherein at least one of the first layer and the second layer comprises a gas/moisture barrier coating which causes a transmission rate of oxygen through the substrate of less than about 0.1 $cm^3/(m^2\ day)$ as measured at 25 degrees C. and with a gas containing 21 volume-percent oxygen, and a transmission rate of water vapor through the substrate of less than about 1 $g/(m^2\ day)$ as measured at 25 degrees C. and with a gas having 100-percent relative humidity.

13. The article of claim 1, wherein the article forms part of an electronic device.

* * * * *